US011920073B2

(12) United States Patent
Gao et al.

(10) Patent No.: US 11,920,073 B2
(45) Date of Patent: Mar. 5, 2024

(54) ETCHING COMPOSITION AND APPLICATION THEREOF

(71) Applicant: PHICHEM CORPORATION, Shanghai (CN)

(72) Inventors: Xiaoyi Gao, Shanghai (CN); Hangjian Hu, Shanghai (CN)

(73) Assignee: PHICHEM CORPORATION, Shanghai (CN)

( * ) Notice: Subject to any disclaimer, the term of this patent is extended or adjusted under 35 U.S.C. 154(b) by 0 days.

(21) Appl. No.: 17/486,963

(22) Filed: Sep. 28, 2021

(65) Prior Publication Data
US 2022/0098487 A1   Mar. 31, 2022

(30) Foreign Application Priority Data
Sep. 29, 2020  (CN) .......................... 202011053002.9

(51) Int. Cl.
| C09K 13/06 | (2006.01) |
| C09K 13/00 | (2006.01) |
| C09K 13/04 | (2006.01) |
| C09K 13/08 | (2006.01) |
| C09K 13/10 | (2006.01) |
| C23F 1/16  | (2006.01) |
| C23F 1/44  | (2006.01) |
| H01L 21/3213 | (2006.01) |

(52) U.S. Cl.
CPC .............. *C09K 13/06* (2013.01); *C09K 13/00* (2013.01); *C09K 13/04* (2013.01); *C09K 13/08* (2013.01); *C09K 13/10* (2013.01); *C23F 1/16* (2013.01); *C23F 1/44* (2013.01); *H01L 21/32134* (2013.01)

(58) Field of Classification Search
None
See application file for complete search history.

(56) References Cited

U.S. PATENT DOCUMENTS 5,512,201 A * 4/1996 Singh ................. C23F 1/44
                                                   252/79.3
2018/0148645 A1* 5/2018 Lee ................... H01L 21/32134

FOREIGN PATENT DOCUMENTS

| CN | 106367755 | * | 2/2017 | ................ C23F 1/18 |
| CN | 108780747 | * | 11/2018 | ............... C23F 1/18 |
| WO | WO2020234395 | * | 11/2020 | ............... C11D 7/50 |

* cited by examiner

*Primary Examiner* — Jiong-Ping Lu
(74) *Attorney, Agent, or Firm* — Gang Yu

(57) ABSTRACT

The present disclosure discloses an etching composition. The etching composition includes: a component A: oxidizing agent 1-30 wt %; a component B: inorganic acid 0.5-20 wt %; a component C: organic acid 0-15 wt %; a component D: chelating agent 0.01-15 wt %; a component E: ionic compound and/or other inorganic acids except the inorganic acid in the component B 0-0.1 wt %; and deionized water.

16 Claims, 1 Drawing Sheet

ETCHING COMPOSITION AND APPLICATION THEREOF

TECHNICAL FIELD

The present disclosure relates to the technical field of chip processing, and in particular to an etching composition and disclosure thereof.

BACKGROUND

In the manufacturing process of integrated circuits, it is often necessary to define extremely fine patterns on wafers. The main way to form these patterns is to transfer the photoresist patterns generated after micro-lithography to a material under the light resistance by virtue of an etching technology, so as to form the complex structure of the integrated circuit. After the chip is manufactured, a special packaging factory will manufacture a welding spot or a bump for the wafer so as to build an interconnection medium for the next interconnection of single chip. The process is called an advanced packaging process. Similarly, the packaging factory will rearrange the line or manufacture bumps for the interconnection of chips through a patterning process. After the wafer is manufactured, the first thing to do is to sputter one layer of titanium and one layer of copper on the whole surface of the wafer by using a magnetron sputtering machine, which is called a seed layer in the industry. Sputtering the titanium layer aims to better bond with the wafer, and sputtering the copper layer aims to make connection for electroplating copper in the next step. Before electroplating copper, it is necessary to use photoresist for patterning, so that the electroplated copper may fall at an open hole. At this time, it may be seen that sputtering titanium and copper on the whole surface is to provide a medium for conducting current during electroplating so as to ensure the opening area of the whole surface can be electroplated with metal. There are generally as few as dozens of chips and as many as thousands of chips on one wafer. Due to the existence of the copper layer and the titanium layer, all interconnection positions on the chips are mutually conductive, that is, in a short-circuit state. Therefore, the titanium and the copper sputtered at the initial stage need to be removed by etching so as to ensure that the chip has a specific electric property while manufacturing the interconnection bumps. Hence, the etching technology plays an important role in the semiconductor manufacturing and advanced packaging processes. Broadly speaking, the so-called etching technology includes a technology for uniformly removing the whole surface of the material and selectively and partially removing patterns. The etching technology may be roughly divided into a wet etching technology and a dry etching technology. At present, wet etching is widely used in the bump manufacturing process of the chip due to its advantages of low cost, high reliability, high yield and excellent etching selectivity.

Although the wet etching is widely applied to the advanced packaging process due to its special advantages, the copper etching composition in the industry still has the following disadvantages:

1. the bump is prone to lateral etching due to isotropic etching;
2. the seed layer is prone to undercut;
3. the aluminum electrode is damaged; and
4. etching is incomplete and uneven due to bubbles formed in the etching chemical reaction process.

Meanwhile, in addition to the above problems, the wet etching also needs to consider the problems of the reaction rate of etching and erosion of the etching composition on the mask (that is, the bump described above).

The manufacturing process of the bump of the chip is relatively mature, but with the smaller size of the component in the integrated circuit, the size of the bump is required to be further reduced. The chemical reaction has no directionality, so the wet etching is isotropic. At this time, when an etching solution is longitudinally etched, lateral etching will occur at the same time, thereby causing an undercut phenomenon and pattern line width distortion. The above problem will affect the reliability of the chip to a great extent.

In the etching composition, the bump includes multiple layers of different metal, and the metal of the seed layer is different from the metal layer on the bump, so that the it is difficult to control the etching effect due to different etching rates of the multiple layers of metal, and it is inevitable that there will be problems such as excessive critical dimension-loss (CD loss) on the bump and the undercut of the copper layer after etching. At present, the main oxidizing agent of the etching composition system disclosed in the prior art is peroxide, typically persulfate and hydrogen peroxide; however, the etching composition taking the persulfate as the oxidizing agent has serious damage to the nickel layer in the structural layer, and the etching composition system taking the hydrogen peroxide as the oxidizing agent has the problem of poor appearance of circuit or welding spot on the etched wafer so as to affect the use reliability of the chip.

In the above hydrogen peroxide etching composition, an acid environment is required for dissolving copper. In the common inorganic acids, sulfuric acid will seriously corrode nickel in the structure, nitric acid will seriously corrode tin or tin alloy and nickel, and hydrochloric acid and hydrofluoric acid have strong permeability and will seriously corrode the lower layer of metal aluminum of the chip. The corrosion will have a fatal impact on the reliability of the chip.

SUMMARY

In order to solve the problem of the undercut of the copper layer after etching in the prior art, the present disclosure provides an etching composition. As described above, it is necessary to etch away the copper layer and the titanium layer in the bump manufacturing process, and the electrical property of the chip is ensured while the interconnection capability of the chip is provided. The copper etching composition of the present disclosure is liquid medicine used for wet etching to corrode the copper layer in the technological process. The etching composition can well control the appearance of the corroded circuit or welding spot by screening and researching an additive under the condition of low metal damage, thereby improving the reliability of the chip in packaging interconnection.

The present disclosure provides an etching composition. The etching composition includes: a component A: oxidizing agent 1-30 wt %; a component B: inorganic acid 0.5-20 wt %; a component C: organic acid 0-15 wt %; a component D: chelating agent 0.01-15 wt; a component E: ionic compound and/or other inorganic acids except the inorganic acid in the component B 0-0.1 wt %; and deionized water.

As a technical solution, the component A: oxidizing agent is selected from at least one of hydrogen peroxide, potassium bisulfate and sodium bisulfate.

As a technical solution, the component B: inorganic acid is selected from one or a mixture of more of nitric acid, sulfuric acid and phosphoric acid.

As a technical solution, the component C: organic acid is selected from one or a mixture of more of citric acid, acetic acid, tartaric acid, malic acid, formic acid, propionic acid, butyric acid, isobutyric acid, valeric acid, isovaleric acid, malonic acid, succinic acid, glutaric acid, adipic acid, glycolic acid, acrylic acid, methacrylic acid, lactic acid, gluconic acid, maleic acid, benzoic acid and salicylic acid.

As a technical solution, there is one to five kinds of organic acids.

As a technical solution, the component D: chelating agent is selected from one or a mixture of more of sodium gluconate, sodium citrate and amino acid.

As a technical solution, the amino acid is selected from one or a mixture of more of ethylenediaminetetraacetic acid, diethylenetriaminepentaacetic acid, alanine, glycine, aspartic acid, glutamic acid, sarcosine, L-cysteine, lysine, cysteine and methionine.

As a technical solution, an optional ionic compound in the component E is an oxide and/or an inorganic salt.

As a technical solution, the inorganic acid in the component E is selected from one or a mixture of more of hydrochloric acid, hydrobromic acid, hydroiodic acid and hydrofluoric acid.

The present disclosure further provides disclosure of the above etching composition to manufacturing of a chip. The chip includes a bump and a seed layer below the bump, wherein the bump includes an upper layer formed by tin or tin alloy, and a lower layer formed by nickel or nickel copper alloy.

In the etching composition of the disclosure, on the basis of the oxidizing agent and the inorganic acid, the components of the organic acid, the chelating agent and the component E are added, therefore, during etching, the lateral etching speed is effectively alleviated, thereby alleviating undercut the copper layer.

Compared with the prior art, some embodiments of the present disclosure provides an etching composition and has the following beneficial effects:

1. small CD loss;
2. small copper layer undercut;
3. no damage or small damage to a substrate, and no influence on the use reliability of the chip;
4. high etching uniformity and no etching residues;
5. good appearance of the circuit or welding spot on the etched wafer; and
6. stable properties of the etching composition.

BRIEF DESCRIPTION OF THE DRAWINGS

In order to further illustrate the beneficial effects of the etching composition and the application thereof provided by the present disclosure, corresponding drawings are provided. It should be noted that the drawings provided in the present disclosure are only individual examples selected from all the drawings and are not intended to limit the claims. All other corresponding maps obtained through the drawings provided in the present application should be considered within the protection scope of the present application.

DETAILED DESCRIPTION OF THE EMBODIMENTS

Figure 1:
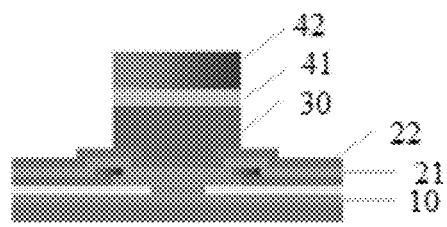
FIG. 1 is a structural schematic diagram before a chip bump is etched.

The contents of the present disclosure may be further understood with reference to the following detailed description of the preferred implementation methods of the present disclosure and the included embodiments. Unless otherwise specified, all technical and scientific terms used in the present disclosure have the same meaning as commonly understood by those of ordinary skill in the field of the present disclosure. If the definitions of specific terms disclosed in the prior art are inconsistent with any definitions provided in the present disclosure, the definitions of the terms provided in the present disclosure shall prevail.

As used in the present disclosure, unless the context clearly indicates otherwise, the features which do not limit the singular and plural forms are also intended to include the features in the plural form. It should also be understood that the term "prepared from" used in the present disclosure is synonymous with "including"; and "including", "comprising", "having", "containing" and/or "containing" represent the composition, step, method, product or device when used in this specification, but do not exclude the presence or addition of one or a plurality of other compositions, steps, methods, products or devices. In addition, when the implementations of the present application are described, "preferred", "preferably", "more preferably" and the like refer to embodiments of the present disclosure capable of providing some beneficial effects under some conditions. However, other embodiments may also be preferred under the same condition or other conditions. In addition, the expression of one or more preferred embodiments does not imply that other embodiments are not available, and is not intended to exclude other embodiments from the scope of the present disclosure.

In order to solve the problem of the undercut of the copper layer after etching in the prior art, the present disclosure provides an etching composition. The etching composition includes: a component A 1-30 wt %; a component B 0.5-20 wt %; a component C 0-15 wt %; a component D 0.01-15 wt %; a component E 0-0.1 wt %; and surplus deionized water, the component A is oxidizing agent, the component B is an inorganic acid, the component C is an organic acid, a component D is a chelating agent, a component E is an ionic compound and/or other inorganic acids except the inorganic acid in the component B.

In the etching composition of the disclosure, on the basis of the oxidizing agent and the inorganic acid, the components of the organic acid, the chelating agent and the component E are added, therefore, during etching, the lateral etching speed is effectively alleviated, thereby alleviating undercut the copper layer.

As an example, the weight percentage of the component A: oxidizing agent in the etching composition may be 1%, 3%, 5%, 8%, 10%, 12%, 15%, 20%, 22%, 25%, 30% and the like; as an example, the weight percentage of the component B: inorganic acid in the etching composition may be 0.5%, 1%, 2%, 3%, 5%, 8%, 10%, 12%, 15%, 18%, 20% and the like; as an example, the weight percentage of the component C: organic acid in the etching composition may be 0.1%, 0.5%, 1%, 2%, 3%, 5%, 8%, 10%, 12%, 15% and the like; as an example, the weight percentage of the component D: chelating agent in the etching composition may be 0.1%, 0.5%, 0.8%, 1%, 1.2%, 1.5%, 1.8%, 2%, 2.2%, 2.5%, 2.8%, 3.2%, 3.5%, 3.8%, 4%, 4,2%, 4.5%, 4.8% 5%, 8%, 10%, 12%, 15% and the like; and as an example, the weight percentage of the component E: the ionic compound and/or other inorganic acids except the inorganic acid in the component B may be 0.5 ppm, 1 ppm, 1.2 ppm, 1.5 ppm, 1.8 ppm, 2 ppm, 2.5 ppm, 2.8 ppm, 3 ppm, 3.2 ppm, 3.5 ppm, 3.8 ppm, 4 ppm, 4.2 ppm, 4.5 ppm, 4.8 ppm, 5 ppm, 5.2 ppm, 5.5 ppm, 5.8 ppm, 6 ppm, 8.5 ppm, 7 ppm, 7.5 ppm, 8 ppm, 8.5 ppm, 9 ppm, 9.5 ppm, 10 ppm, 15 ppm, 20 ppm, 25 ppm, 30 ppm, 35 ppm, 40 ppm, 45 ppm, 50 ppm, 60 ppm, 65 ppm, 68 ppm, 70 ppm, 75 ppm, 30 ppm, 82 ppm, 85 ppm, 90 ppm, 95 ppm, 100 ppm and the like.

In, some embodiments, the etching composition includes: the component A 1-25 wt %; the component B 0.5-15 wt %; the component C 0-10 wt %; the component D 0.01-10 wt %; the component E 0.1-100 ppm; and deionized water; further preferably, the etching composition includes: the component A 1-20 wt %; the component B 0.5-15 wt %; the component C 0-5 wt %; the component D 0.1-10 wt %; the component E 0.1-60 ppm; and deionized water. Preferably the etching composition, comprising: the component A 1-15 wt %, the component B 1-15 wt %, the component C 0.1-5 wt %, the component D 0.1-8 wt %, the component E 0.5 ppm-50 ppm and surplus the deionized water.

In some embodiments, the component A is selected from at least one of hydrogen oxide, potassium hydrogen persulfate and sodium hydrogen persulfate; and in view of controllable etching, process and improvement of excessive etching, further preferably, the oxide is hydrogen peroxide.

In some embodiments, the hydrogen peroxide accounts for 1-15 wt % of the etching composition; further preferably, the hydrogen peroxide accounts for 1-10 wt % of the etching composition; and more further, the hydrogen peroxide accounts for 2-10 wt % of the etching composition.

In some embodiments, the component B does not include hydracid.

In some embodiments, the component B is selected from one or a mixture of more of nitric acid, uric acid and phosphoric acid; and in view of adjusting the etching reaction rate, further preferably, the component B: inorganic acid is phosphoric acid. The inventor found in the research that the inorganic acid may dissolve copper and has a positive effect on the etching reaction rate, but when the use amount of the inorganic acid exceeds 20 wt %, it will cause material surplus and increase the cost burden.

In some embodiments, the component C is selected from one or a mixture of more of citric acid, acetic acid, tartaric acid, malic acid, formic acid, propionic acid, butyric acid, oxalic acid, isobutyric acid, valeric acid, isovaleric acid, malonic acid, succinic acid, glutaric acid, adipic acid, glycolic acid, acrylic acid, methacrylic acid, lactic acid, gluconic acid, maleic acid, benzoic acid and salicylic acid; preferably, the component C is selected from one or a mixture of more of citric acid, acetic acid, tartaric acid, malic acid, butyric acid, oxalic acid, malonic acid, succinic acid, glycolic acid, acrylic acid, lactic acid, maleic acid, benzoic acid and salicylic acid; further preferably, the component C is selected from one or a mixture of acetic acid, citric acid, tartaric acid, malic acid, oxalic acid, formic acid, acrylic acid, lactic acid, maleic acid, benzoic acid and salicylic acid; and more further, the component c is selected from one or a mixture of acetic acid, citric acid, tartaric acid, malic acid, oxalic acid, formic acid, acrylic acid, lactic acid, maleic acid; benzoic acid and salicylic acid.

In some embodiments, there is one to five types of the organic acids; preferably, there are at least two, or at least three or at, least four types of the organic acids; and further preferably, there is one, or two, or three or four types of the organic acids. The inventor found in the research that when there are more than five types of organic acids, etching liquid affects the metal etching rate and the etching uniformity.

In order to ensure the safety of the etching process and solve the problem of copper residue, the etching time will be increased by 15% on the basis of the general process allowance in the actual manufacturing process. In some cases, the etching time will even be increased to 100%, which leads to the problem of uneven metal etching of the etched copper metal. The uniformity of the etched metal is generally below 15%. In order to ensure the etching uniformity, ensure the safety of the etching process and solve the problem of etched metal residue, the inventor of the present application found through a large number of experiments that adding the organic acid that accounts for not more than 15% of the weight of the etching composition can effectively improve the copper etching uniformity and the problem of metal residue and ensure the safety of the etching process, but the inventor also found that the etching rate of the copper will be obviously inhibited when the content of the organic acid exceeds 10%. Therefore, preferably, the content of the organic acid in the etching composition provided by the present disclosure does not exceed 10 wt %. In order to ensure the etching uniformity, solve the problem of metal residue in etching and ensure the etching safety, the weight percentage of the organic acid in the etching is preferably 0-10%, further preferably is 0.1-5%, more preferably is 1-5%.

In some embodiments, the component a chelating agent is selected from one or a mixture of more of sodium gluconate, sodium citrate and amino acid; and further preferably, the component D: chelating agent is amino acid.

In some embodiments, the amino acid is selected from one or a mixture of more of ethylenediamine tetraacetic acid, diethylenetriamine pentaacetic acid, alanine, glycine, aspartic acid, glutamic acid, sarcosine, L-cysteine, lysine, cysteine and methionine; further preferably, the amino acid is selected from one or a mixture of more of alanine, glycine, lysine, cysteine and methionine; more further, the amino acid is selected from one or a mixture of more of lysine, cysteine and methionine. The inventor found in the research and development process that adding the amino acid of the present disclosure into the etching composition may play a role in reducing the CD of the bump and the seed layer. The inventor also found in a large number of practices that when the weight percentage of the chelating agent in the system is 0.1-8%, the CD of the bump of the etched copper is reduced with the increase of the chelating agent content. When the weight percentage of the chelating agent in the etching composition exceeds 8%, the etching uniformity of the copper will be greatly reduced, and the occurrence rate of the copper residue will be greatly increased. The inventor found in careful verification that when the content of the chelating agent approaches 2 wt %, the positive action of the chelating agent tends to be stable, that is, the improvement on the CD reaches the optimal value. Based on the above overall considerations, the component. D accounts for 1-5 wt % of the etching composition.

As some embodiments, when the component E is an ionic compound, the ionic compound is an oxide and/or an inorganic salt.

In some embodiments, the oxide is alkaline oxide and/or amphoteric oxide; further preferably, the alkaline oxide is selected from one or a mixture of more of sodium oxide, calcium oxide and magnesium oxide, and the amphoteric oxide is zinc oxide and/or manganese oxide.

In some embodiments, the inorganic salt is selected from halide salt, wherein the halide salt is selected from one or a mixture of more of copper chloride, ferric chloride, sodium, chloride, ammonium chloride, potassium chloride, calcium chloride, copper bromide, iron bromide, sodium bromide, ammonium bromide, copper iodide, iron iodide, sodium iodide, ammonium iodide, copper fluoride, iron fluoride, sodium fluoride and ammonium fluoride; further preferably, the halide salt is selected from one or a mixture of copper chloride, ferric chloride, sodium chloride, ammonium chloride, potassium chloride, calcium chloride, copper fluoride, iron fluoride, sodium fluoride and ammonium fluoride. In some embodiments of the disclosure the component E is halide salt, the halide salt accounts for 0.5 ppm-50 ppm of the etching composition.

In some embodiments, when the component E is inorganic acid, the inorganic acid is preferably other inorganic acids except the inorganic acid in the component B; further preferably, the inorganic acid is hydracid which is selected from one or a mixture of more of hydrochloric acid, hydrobromic acid, hydroiodic acid and hydrofluoric acid; further preferably, the hydracid is hydrochloric acid and/or hydrofluoric acid; more further, the hydracid is hydrochloric acid.

In some embodiments, the inorganic salt accounts for 0.1-100 ppm of the weight of the etching composition; and when the component E is hydracid, the hydracid accounts for 0.01-5 ppm of the weight of the etching composition. The inventor found in the research process that the component E may effectively improve the undercut problem of the copper; and below 100 ppm, the undercut amount increases as the concentration of the component E increases.

In some embodiments, the component E is mixture of at least one halide salt and at least one hydracid, wherein the halide salt is selected from one or a mixture of more of copper chloride, iron chloride, sodium chloride, ammonium chloride, potassium chloride, calcium chloride, copper fluoride, iron fluoride, sodium fluoride and ammonium fluoride; and the hydracid is hydrochloric acid and/or hydrofluoric acid.

In some embodiments, the component E accounts for 0.1-80 ppm of the weight of the etching, composition and is a mixture of halide salt and hydracid, wherein the halide, salt accounts for 0.1-50 ppm of the weight of the etching composition, preferably the halide salt accounts for 0.6 ppm-35 ppm of the weight of the etching composition, and the hydracid accounts for 0.1-30 ppm of the weight of the etching composition, preferably the hydracid accounts for 0.4-25 ppm of the weight of the etching composition. As an example, the weight proportion of the halide salt in the etching composition may be 0.1 ppm, 0.3 ppm, 0 ppm, 0.8 ppm, 1 ppm, 1.2 ppm, 1.5 ppm, 2 ppm, 2.5 ppm, 3 ppm, 3.5 ppm, 4 ppm, 4.5 ppm, 5 ppm, 6 ppm, 7 ppm, 8 ppm, 9 ppm, 10 ppm, 15 ppm, 20 ppm, 25 ppm, 30 ppm, 35 ppm, 40 ppm, 50 ppm and the like; and as an example, the weight proportion of the hydracid in the etching composition may be 0.1 ppm, 0.3 ppm, 0.5 ppm, 0.8 ppm, 1 ppm, 1.2 ppm, 1.5 ppm, 2 ppm, 2.5 ppm, 3 ppm, 3.5 ppm, 4 ppm, 4.5 ppm; 5 ppm, 6 ppm, 7 ppm, 8 ppm, 9 ppm, 10 ppm, 15 ppm, 20 ppm 25 ppm, 30 ppm and the like.

In the present disclosure, the component A: oxide and the component B: inorganic acid are the main components for controlling the etching rate of metal, NA/herein the utilization rate is the highest when the weight, ratio of the component A:oxide to the component B:inorganic acid is 1:2-2:1, otherwise, the larger amount of materials in the component A:oxide and the component B:inorganic acid will be excessive. Although there is no obvious negative effect, it may be regarded as invalid addition, causing cost burden. The preferred concentration is defined according to the processing process time of the bump. Too high or too low metal etching rate will make the process difficult to control. The metal etching rate described herein is empirically optimal at 35-300 Å/s. The addition of the component C can ensure etching uniformity and safety and solve the problem of copper residue; and the component D can adjust the ion concentration of the system and reduce the CD, loss of the bump and the seed layer. The inventor also unexpectedly found in practice, that when the component E includes halide salt and hydracid at the same time, the etching composition not only can effectively improve the undercut problem, but also can effectively improve the appearance of the etched metal, effectively improve the etching uniformity of the metal and effectively improve the stability of the etching composition.

A preparation method of the etching composition provided by the present disclosure may be any one well known to those skilled in the art, for example, physical blending.

The present disclosure further provides application of the etching composition which is used to manufacture display devices, and further, the etching composition is used to manufacture a bump on a chip.

According to the present disclosure, the chip includes a bump and a seed layer below the bump, wherein the bump includes an upper layer formed by tin or tin alloy, and a lower layer formed by nickel or nickel copper alloy. The tin alloy in the present application is not particularly limited to the type, and generally refers to alloy formed by tin and metal such as copper, silver, lead and the like. In some embodiments, an electroplating layer is arranged between the bump and the seed layer.

Figure 2:
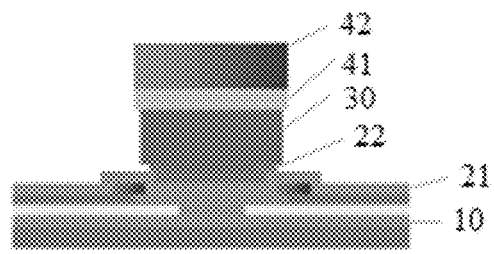
FIG. 2 is a structural schematic diagram after a chip bump is etched.

As shown in FIG. 1 and FIG. 2, they are schematic diagrams of bump before and after chip etching, wherein the chip includes a bump and a seed layer below the bump, the seed layer on a Al electrode; the bump includes an upper layer (Sn/Ag 42) formed by tin silver alloy and a lower layer formed by nickel (Ni 41); the seed layer includes a copper seed layer 22 and a titanium seed layer 21 from top to bottom; and an electroplating copper layer 30 is arranged between the bump and the seed layer.

The structure described here, which includes the upper layer formed by tin or tin alloy and the lower layer formed by the nickel or the lower layer formed by the nickel and the copper is a metal bump manufacturing material commonly used in the advanced packaging process, and has the advantages of stable property and low cost, wherein the nickel is a connecting barrier layer of the electroplating copper or copper seed layer and plays a role in blocking the mutual migration between the copper and tin metal parts, thereby preventing the reliability of the bump from being affected. The necessity of the electroplating copper on different types of chips may be considered according to the design requirements. The tin alloy and the tin are interconnection materials when the chip is further packaged, and are selected according to the electrical property requirement of the design.

EMBODIMENTS

The technical solutions of the present disclosure are described below in detail through the embodiments, but the protection scope of the present disclosure is not limited to the embodiments. Unless otherwise specified, the raw materials in the present disclosure are all commercially available.

The test indexes of the property parameter of the etching composition provided by present disclosure are:

1. CD loss, as shown in FIG. 1 to FIG. 2, the shrinkage amount of the electroplating copper in a horizontal direction before and after copper etching is called CD loss (unit: μm). After corrosion, the electroplating copper and the copper seed layer should be as level as possible with the Ni or Sn/Ag layer without shrinkage, so low CD is the excellent performance value, and CD is required to be less than 1 μm in general application.

2. Undercut, as shown in FIG. 1 to FIG. 2, on the single side of the bump, the shrinkage amount of the etched copper seed layer relative to the electroplating copper or nickel layer in a horizontal direction is called undercut (unit: μm). After corrosion, the electroplating copper and the copper seed layer should be as level as possible with the Sn/Ag layer without shrinkage, so low undercut is the excellent performance value, and CD is required to be less than 1 μm in general application.

3. Uniformity (unit: %), a certain number of points (the present disclosure adopts a method for uniformly collecting 24 points by using an 8-inch wafer) are collected on a wafer for measuring a copper etching thickness X. Uniformity= $(X_{max}-X_{min})/(2X_{avg})$, wherein $X_{max}$, $X_{min}$ and $X_{avg}$ respectively represent the maximum, minimum and average value of the etching thickness, small uniformity is the excellent performance value, and the uniformity is required to be less than 5% in general application.

4. Metal corrosion rate, based on tin or tin alloy, nickel and aluminum damage rate and with a unit of Å/s, small corrosion rate is the excellent performance value, and general application requires that the nickel damage is less than 20 Å/s, the tin or tin alloy damage is less than 0.1 Å/s, and the aluminum damage is less than 20 Å/s.

Embodiment 1-14 and comparative example 1 provide an etching composition, and the components in each example are shown in Table 1. The preparation method of the etching composition is physical blending.

TABLE 1

| Embodiments | Component A | Component B | Component C | Component D | Component E | | Solvent |
|---|---|---|---|---|---|---|---|
| Comparative example 1 | Hydrogen peroxide 15 wt % | Phosphoric acid 15 wt % | / / | / / | / / | | Deionized water Balance |
| Embodiment 1 | Hydrogen peroxide 10 wt % | Phosphoric acid 5 wt % | Acetic acid 2 wt % | Glycine 5 wt % | Ammonium fluoride 0.5 ppm | | Deionized water Balance |
| Embodiment 2 | Hydrogen peroxide 8 wt % | Phosphoric acid 8 wt % | Citric acid 3 wt % | Lysine 1 wt % | Copper chloride 10 ppm | | Deionized water Balance |
| Embodiment 3 | Hydrogen peroxide 10 wt % | Phosphoric acid 5 wt % | Benzoic acid 2 wt % | Methionine 1 wt % | Zinc oxide 5 ppm | | Deionized water Balance |
| Embodiment 4 | Hydrogen peroxide 10 wt % | Phosphoric acid 10 wt % | Salicylic acid 3 wt % | Sarcosine 2 wt % | Potassium iodide 30 ppm | | Deionized water Balance |
| Embodiment 5 | Hydrogen peroxide 8 wt % | Phosphoric acid 8 wt % | Acetic acid 3 wt % | L-cysteine 2 wt % | Calcium oxide 5 ppm | | Deionized water Balance |
| Embodiment 6 | Hydrogen peroxide 2 wt % | Phosphoric acid 1 wt % | Lactic acid 5 wt % | Cystine 3 wt % | Sodium Chloride 50 ppm | | Deionized water Balance |
| Embodiment 7 | Hydrogen peroxide 5 wt % | Phosphoric acid 10 wt % | Glycolic acid 1 wt % | Alanine 3 wt % | Sodium fluoride 1 ppm | | Deionized water Balance |
| Embodiment 8 | Hydrogen peroxide 10 wt % | Phosphoric acid 15 wt % | Maleic acid 1 wt % | Lysine 5 wt % | Potassium chloride 2 ppm | | Deionized water Balance |
| Embodiment 9 | Hydrogen peroxide 10 wt % | Phosphoric acid 15 wt % | Maleic acid 1 wt % | Lysine 5 wt % | Potassium chloride 1 ppm | Hydrochloric acid 1 ppm | Deionized water Balance |
| Embodiment 10 | Hydrogen peroxide 2 wt % | Phosphoric acid 1 wt % | Lactic acid 5 wt % | Cystine 3 wt % | Sodium oxide 35 ppm | Hydrochloric acid 15 ppm | Deionized water Balance |
| Embodiment 11 | Hydrogen peroxide 5 wt % | Phosphoric acid 1 wt % | Glycolic acid 1 wt % | Alanine 3 wt % | Sodium fluoride 0.6 ppm | Hydrochloric acid 0.4 ppm | Deionized water Balance |
| Embodiment 12 | Hydrogen peroxide 10 wt % | Phosphoric acid 10 wt % | Salicylic acid 3 wt % | Sarcosine 2 wt % | Potassium iodide 5 ppm | Hydrochloric acid 25 ppm | Deionized water Balance |
| Embodiment 13 | Potassium bisulfate 10 wt % | Sulfuric acid 5 wt % | Acetic acid 2 wt % | Glycine 1 wt % | Copper chloride 10 ppm | | Deionized water Balance |
| Embodiment 14 | Potassium bisulfate 10 wt % | Phosphoric acid 5 wt % | Citric acid 3 wt % | Glycine 1 wt % | Ammonium fluoride 0.5 ppm | | Deionized water Balance |

Performance Test Results

The etching compositions obtained by the embodiments 1-14 and the comparative example 1 are subjected to performance test, the test contents include CD loss, undercut, uniformity and metal corrosion rate, and the test result is shown in Table 2.

In order to ensure parallel implementation of the implementation solution and the comparison solution, the wafer with the structure shown in FIG. 1 (the thickness of Cu seed layer of wafer for experiment is 3000 Å) is used in the experiment process for performing liquid medicine soaking experiment. The experiment temperature is constantly controlled at 25° C.

In addition, on the premise of ensuring the same experiment method in the experiment, it should be noted that the influence factors of the CD and undercut values are formula components and excessive etching amount. Here, according to the convention when the formula is used, the excessive etching amount is 100% as the background condition of the experiment. The excessive etching amount in the present application is the background condition of the experiment (unit: %), and the excessive etching amount=$(t-t_0)/t_0$, wherein the time for the copper surface to be completely corroded is $t_0$, and the actual corrosion time is t.

TABLE 2

| Embodiments | CD/μm | undercut/μm | Uniformity/% | Metal corrosion rate/(Å/s) | | |
|---|---|---|---|---|---|---|
| | | | | Tin or tin alloy | Nickel | Aluminum |
| Comparative example 1 | 3.21 | 2.53 | 8.8 | <0.1 | 18.2 | 24.4 |
| Embodiment 1 | 0.73 | 0.63 | 4.3 | <0.1 | 9.3 | 8.3 |
| Embodiment 2 | 0.53 | 0.52 | 3.3 | <0.1 | 8.1 | 11.2 |
| Embodiment 3 | 0.47 | 0.57 | 4.5 | <0.1 | 9.4 | 9.6 |
| Embodiment 4 | 0.83 | 0.46 | 4.1 | <0.1 | 11.3 | 11.2 |
| Embodiment 5 | 0.32 | 0.24 | 3.8 | <0.1 | 8.4 | 12.4 |
| Embodiment 6 | 0.53 | 0.27 | 3.2 | <0.1 | 2.6 | 8 |
| Embodiment 7 | 0.52 | 0.23 | 2.8 | <0.1 | 6.1 | 12.5 |
| Embodiment 8 | 0.48 | 0.69 | 4.6 | <0.1 | 12.9 | 9.8 |
| Embodiment 9 | 0.28 | 0.45 | 2.8 | <0.1 | 12.0 | 9.2 |
| Embodiment 10 | 0.30 | 0.24 | 2.0 | <0.1 | 2.0 | 8.5 |
| Embodiment 11 | 0.29 | 0.20 | 1.7 | <0.1 | 5.8 | 10.9 |
| Embodiment 12 | 0.35 | 0.40 | 2.5 | <0.1 | 9.5 | 8.2 |
| Embodiment 13 | 3.59 | 1.14 | 6.8 | 0.32 | 37.8 | 168 |
| Embodiment 14 | 1.83 | 0.83 | 6.3 | 0.13 | 23.2 | 12.7 |

It may be seen from comparison of data of the comparative examples and the embodiments that the etching composition provided by the present disclosure has a great improvement in the CD loss, undercut and uniformity, and has low metal corrosion rate; and when the etching composition is applied to substrate etching, the substrate is basically not damaged, and the use reliability of the chip is greatly improved.

The foregoing examples are merely illustrative and are used to explain some features of the method according to the present disclosure. The appended claims are intended to claim a scope which may be conceived to be as wide as possible, and the embodiments represented herein are merely description of implementations selected according to the combination of all possible embodiments. Therefore, the intention of the applicant is that the appended claims are not limited by the selection of the examples for describing the features of the present disclosure. Some numerical ranges used in the claims also include sub-ranges therein, and the change of these ranges should also be interpreted as being covered by the appended claims where possible.

What is claimed is:

1. An etching composition, comprising: a component A 1-20 wt %, a component B 0.5-15 wt %, a component C 0.1-5 wt %, a component D 0.1-10 wt %, a component E 0.1 ppm-60 ppm and surplus deionized water, the component A is oxidizing agent, the component B is an inorganic acid, the component C is an organic acid, a component D is a chelating agent, a component E is an ionic compound and/or other inorganic acids except the inorganic acid in the component B;

the weight ratio of the component A to the component B is 1:2-2:1;

the ionic compound is an oxide and/or an inorganic salt, the oxide is alkaline oxide and/or amphoteric oxide; the alkaline oxide is selected from one or a mixture of more of a group consist of sodium oxide, calcium oxide and magnesium oxide, and the amphoteric oxide is zinc oxide and/or manganese oxide;

the inorganic salt is a halide salt, the halide salt is selected from one or a mixture of more of a group consist of copper chloride, ferric chloride, sodium chloride, potassium chloride, calcium chloride, copper bromide, iron bromide, sodium bromide, ammonium bromide, copper iodide, iron iodide, sodium iodide, copper fluoride, iron fluoride, sodium fluoride and ammonium fluoride;

the component B is selected from one or a mixture of more of a group consist of nitric acid and phosphoric acid;

the component C is selected from one or a mixture of more of a group consist of citric acid, acetic acid, tartaric acid, malic acid, formic acid, propionic acid, oxalic acid, butyric acid, isobutyric acid, valeric acid, isovaleric acid, malonic acid, succinic acid, glutaric acid, adipic acid, glycolic acid, acrylic acid, methacrylic acid, lactic acid, gluconic acid, maleic acid, benzoic acid and salicylic acid.

2. The etching composition according to claim 1, wherein the component A is selected from at least one or more of a group consist of hydrogen peroxide, potassium bisulfate and sodium bisulfate.

3. The etching composition according to claim 2, wherein the hydrogen peroxide accounts for 1-15 wt % of the etching composition.

4. The etching composition according to claim 1, wherein a kind of the organic acid of the component C is one to five kinds, the organic acid accounts for 1-5 wt % of the etching composition.

5. The etching composition according to claim 1, wherein the component D is selected from one or a mixture of more of a group consist of sodium gluconate, sodium citrate and amino acid, the component D accounts for 1-5 wt % of the etching composition.

6. The etching composition according to claim 5, wherein the amino acid is selected from one or a mixture of more of a group consist of ethylenediaminetetraacetic acid, diethylenetriaminepentaacetic acid, alanine, glycine, aspartic acid, glutamic acid, sarcosine, L-cysteine, lysine, cysteine and methionine.

7. The etching composition according to claim 1, wherein the halide salt is selected from one or a mixture of a group consist of copper chloride, ferric chloride, sodium chloride, ammonium chloride, potassium chloride, calcium chloride, copper fluoride, iron fluoride, sodium fluoride and ammonium fluoride.

8. The etching composition according to claim 1, wherein the ionic compound is the inorganic salt, the inorganic salt accounts for 0.1 ppm-100 ppm of the etching composition.

9. The etching composition according to claim 8, wherein the inorganic acid in the component E is hydracid, the hydracid is selected from one or a mixture of more of a group consist of hydrochloric acid, hydrobromic acid, hydroiodic acid and hydrofluoric acid.

10. The etching composition according to claim 9, wherein the hydracid accounts for 0.01 ppm-5 ppm of the etching composition.

11. The etching composition according to claim 9, wherein the component E is the halide salt, the halide salt accounts for 0.5 ppm-50 ppm of the etching composition, or
the component E is a mixture of the halide salt and the hydracid, the component E accounts for 0.1 ppm-80 ppm of the etching composition.

12. The etching composition according to claim 9, wherein the halide salt accounts for 0.1 ppm-50 ppm of the etching composition.

13. The etching composition according to claim 1, wherein the inorganic acid in the component E is hydracids, the hydracids is selected from one or a mixture of more of a group consist of hydrochloric acid, hydrobromic acid, hydroiodic acid and hydrofluoric acid.

14. The etching composition according to claim 13, wherein the hydracid accounts for 0.01 ppm-5 ppm of the etching composition.

15. The etching composition according to claim 1, wherein the etching composition, comprising: the component A 1-15 wt %, the component B 1-15 wt %, the component C 0.1-5 wt %, the component D 0.1-8 wt %, the component E 0.5 ppm-50 ppm and surplus the deionized water.

16. Use of the etching composition according to claim 1 in the process for manufacture a bump on a chip, the bump includes an upper layer formed by tin or tin alloy, and a lower layer formed by nickel or nickel copper alloy.

* * * * *